United States Patent [19]

Braden

[11] 3,778,532

[45] Dec. 11, 1973

[54] ELECTRICAL CIRCUIT COMPONENT HAVING SOLDER PREFORM CONNECTION MEANS

[75] Inventor: Denver Braden, San Diego, Calif.

[73] Assignee: Illinois Tool Works Inc., Chicago, Ill.

[22] Filed: July 3, 1972

[21] Appl. No.: 268,357

[52] U.S. Cl. ................ 174/74 R, 29/626, 174/68.5, 228/58, 317/101 CC, 338/329

[51] Int. Cl. ............................................ H05k 1/18

[58] Field of Search .............. 174/68.5, 84 R, 94 R, 174/74; 228/56, 3; 29/475, 626; 317/101 A, 101 CC; 338/328, 329

[56] References Cited

UNITED STATES PATENTS

| | | | |
|---|---|---|---|
| 1,823,028 | 9/1931 | Caldwell | 228/56 X |
| 3,451,122 | 6/1969 | Kuhns et al. | 29/475 |
| 3,612,963 | 10/1971 | Piper et al. | 317/101 CC X |

*Primary Examiner*—Darrell L. Clay
*Attorney*—Robert W. Beart et al.

[57] ABSTRACT

An electrical circuit component including a solder preform which envelops connection terminals on the ends of an electrical circuit body of the element is disclosed. When heat is applied to the solder preform, the solder flows and electrically connects the component into an electric circuit. The solder preform has two end portions that are joined by a bar of reduced cross section which melts upon the application of heat. The solder preform also includes laterally extending flaps which embrace the side edges of the circuit element.

6 Claims, 8 Drawing Figures

ELECTRICAL CIRCUIT COMPONENT HAVING SOLDER PREFORM CONNECTION MEANS

BACKGROUND OF THE INVENTION

The present invention relates to an electrical component having preformed fusible electrical connection means and a method of making soldered connections to a substrates.

In the fabrication of electrical and electronic circuit modules, miniature electronic and electrical components are mounted on and/or electrically connected to circuit patterns formed on a dielectric substrate. In most instances when the component is incorporated into the circuit, the most common method of connection is that of soldering. While this has a good reliability factor, it is definitely dependent upon a proper amount of solder and flux. With ever decreasing dimensional limits for such soldering connections, as the result of the miniaturization of components, the amount of possible solder build-up upon the component prior to installation has become increasingly difficult. Hand soldering techniques have become undesirable because of the dimensional limitations and the cost involved in making such connections. The concept of dip soldering and preform techniques are also increasingly undesirable because of the difficulty in achieving the correct and sufficient solder build-up on the connection.

SUMMARY OF THE INVENTION

The present invention contemplates an electrical component, such as a chip capacitor, and a preassembled solder preform on such a component. The preform is designed to envelop the terminal portions of the component in such a manner as to substantially increase the solder build-up when the component is attached to the appropriate circuitry. The solder preform of the present invention is a unitary device which includes an interconnection between the end or terminal portions of the preform. This interconnection is accomplished by providing a strip of soldering material which will break down upon application of heat and which will flow to either terminal connection portion thus increasing the solder build-up.

The description which follows and the attached drawings will set forth an electrical component, which for purposes of illustration is shown to be a chip capacitor, which utilizes a unique solder preform preassembled on such a chip body and which is designed to provide the proper amount of solder build-up to electrically and mechanically connect a component to a substrate printed circuit board or the like.

DESCRIPTION OF THE PREFERRED EMBODIMENTS

Figures 1, 2, 3, 5, 6, 7, 8:
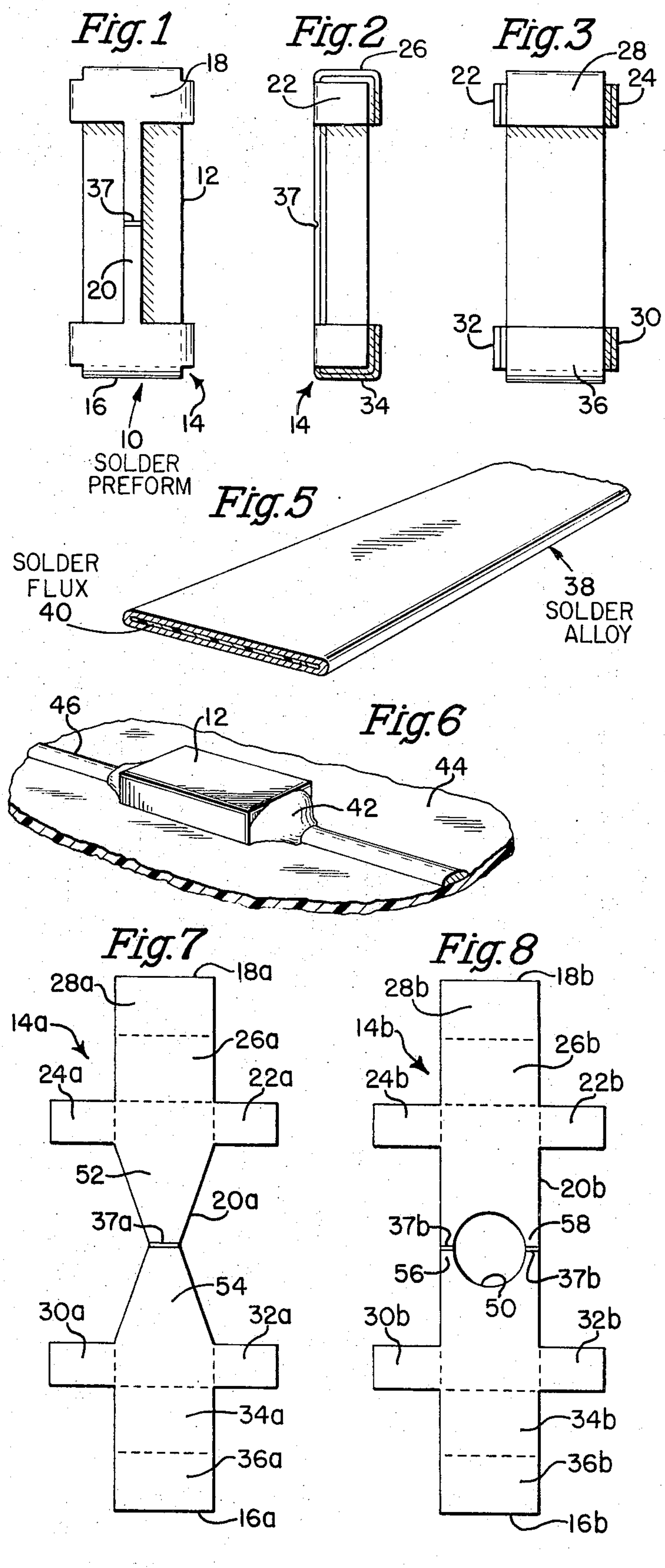
FIG. 1 is a top plan view of an electrical component of the present invention showing the preform preassembled on an electrical body.
FIG. 2 is a side view of the electrical component shown in FIG. 1.
FIG. 3 is a bottom plan view of the electrical component shown in FIG. 1.
FIG. 5 is a perspective view of the solder stock from which the preforms may subsequently be stamped.
FIG. 6 is a view in perspective of the component after it has been connected to a substrate or printed circuit board.
FIGS. 7 and 8 are plan views of alternate embodiments of the preform which may be utilized in the present invention.

The electrical component 10 of the present invention is shown in FIG. 1 as comprising a chip-like body 12 and a solder pre-form 14. The body 12 may be a capacitor, resistor, etc., which includes end portions to be soldered to an appropriate circuit or substrate.

The term "solder" as used in describing this invention is intended to cover the use of any alloy, metal or material which has a lower melting point than that of the body or the conductor or circuitry upon which it is to be secured. The preform 14 is a one-piece connection unit which includes a pair of end portions 16 and 18 which are joined by a connecting bar 20. The end portions of the preform are shaped to envelop the terminal portions of the chip body 12. Flap portions 22, 24, 26 and 28 are formed on one end of the preform while similarly configured flap portions 30, 32, 34 and 36 are formed on the opposite end of the platform.

Figure 4:
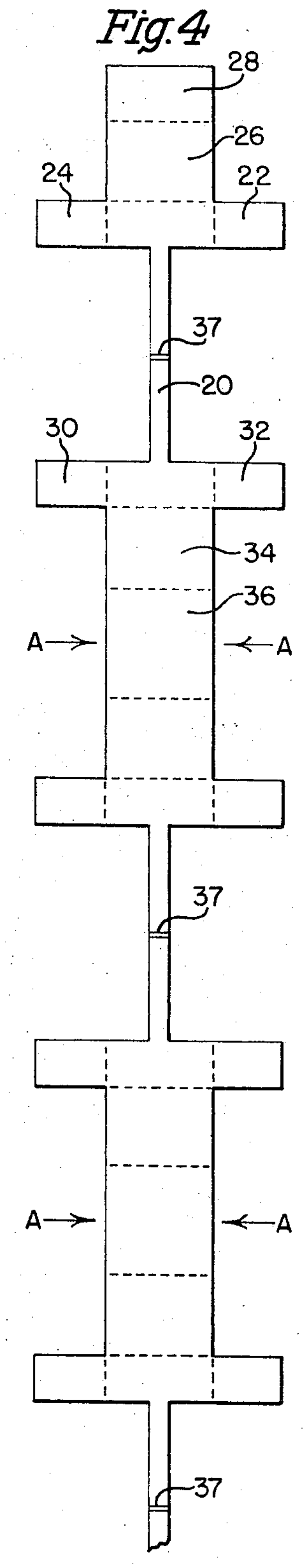
FIG. 4 is a plan view of a strip of a plurality of preforms prior to the preassembly with an electrical component body.

These flaps may be folded along the lines shown in FIG. 4 to assume the positions shown in FIGS. 1–3 and cover at least a portion of upper and lower planar surfaces of the terminal portions of the chip body and edges connecting these planar surfaces to one another. In this way, the preform and chip body form a preassembled component for subsequent electrical and mechanical attachment to a circuit.

One of the features of the invention is the connecting bar 20 which facilitates the assembly of the preform to the chip. Moreover, this connecting band is designed to break down and disassociate the end portions 16 and 18 upon the application of the proper amount of heat. This is accomplished by providing the bar 20 with at least a portion, along its length, having a relatively small cross-sectional area. The preferred embodiment in FIGS. 1–3 shows this band 20 having substantially uniform width extending between end portions 16 and 18. The width of this band is substantially smaller than the width of the chip body and as such will break down upon the application of heat. A score or depression 37 at the midpoint of the bar 20 will enable the solder of the bar to divide equally since, upon application of heat, each section opposite the score will flow to its respective extremity.

As shown in FIG. 6, the fusible electrically conductive fillets or connections 42 have been formed by the flowing of the end portions of the preform as well as the flowing of at least a portion of the bar 20 to either end of the chip body. Thus, a suitable amount of solder is made available for mounting a chip body to a substrate 44 with thin metallic film patterns 46 formed thereon.

FIGS. 7 and 8 describe alternate configurations of the connecting bar 20. In FIG. 7 a slightly modified preform **14*a* is shown which includes flap portions 22*a*, 24*a*, 26*a* and 28*a* at one extremity and similar flap portions 30*a*, 32*a*, 34*a* and 36*a* at the other extremity. The connecting portion 20*a* is basically a pair of triangular or truncated triangular portions 52 and 54 with apexes connected by a score 37a to allow portions 52 and 54** to flow towards the associated extremity of the component and appreciably increase the solder and flux build-up at that point.

The preform 14b shown in FIG. 8 likewise has end portions 16b and 18b which include respectively flap portions 22b–28b and 30b–36b. The connecting bar portion 20b is formed with an aperture 50 therein. This aperture allows the end portions to be connected by two relatively small portions 56 and 58 which, in accordance with the invention, are designed to break down upon the application of heat in the manner described relative to the embodiment of FIG. 1. Score marks 37b may be provided at the portions 52 and 54 to enhance the separability of the two end portions.

The stock from which the preform 14 is cut may be any conventional hollow core, flux filled solder wire or solder wire without flux depending on the application desired. FIG. 5 shows such a stock 38 after it is fed through a series of gradual flattening rollers to produce a hollow, rectilinear cross section with flux 40 enclosed therein. From such flattened stock, a series of interconnected preforms may be cut by a stamping die or the like to form a strip such as shown in FIG. 4. The individual preforms are produced by severing the strip at sections A—A. In the case of flux filled solder, the preforms may be cut while wiping the metal shut to seal the flux within the solder 38.

The preassembled component 10 thus presents a chip body which has terminations completely enveloped with solder stock in the manner described to maximize the solder build-up in an electrical connection. The preassembled component can be placed in the circuit without additional preparations, such as flux, etc. Upon application of heat, the solder envelope melts, connecting the chip to the circuit. The amount of solder and flux is of a magnitude not normally available by any other method except that of hand application which would be prohibitive due to expense and lack of control.

While the invention has been described in connection with preferred embodiments, it will be understood that it is not intended to limit the invention to those embodiments. On the contrary, it is intended to cover all alternatives, modifications and equivalents as may be included within the spirit and broad scope of the invention as defined by the appended claims.

I claim:

1. An electric circuit component including an elongated circuit element having first and second connection terminal ends, preformed connection means formed of a fusible, electrically conductive bonding medium enveloping said first and second connection terminal ends so that the application of heat to said component allows the connection means to flow and electrically connect the component into an electrical circuit, said preformed connection means including at least two interconnected end portions with both of said end portions including folded-over edges which embrace an upper and lower surface of said circuit element.

2. An electrical circuit component in accordance wirh claim 1, wherein the end portions are interconnected by a band of the same fusible, electrically conductive bonding medium which forms the end portions.

3. An electrical circuit component in accordance with claim 1, wherein the end portions are joined by a bar of electrically conductive bonding material having a section of reduced cross section to allow the end portions to be readily disassociated from one another upon the application of heat to the component.

4. An electric circuit component including an elongated circuit element having first and second connection terminal ends, preformed connection means formed of a fusible, electrically conductive bonding medium enveloping said first and second connection terminal ends so that the application of heat to said component allows the connection means to flow and electrically connect the component into an electrically circuit, said preformed connection means being a substantially thin flat solder strip which embraces both a top and a bottom surface of the circuit element, and includes laterally extending flaps which engage the side edges of the circuit element adjacent said connection terminal ends.

5. An electric circuit component including an elongated circuit element having first and second connection terminal ends, preformed connection means formed of a fusible, electrically conductive bonding medium enveloping said first and second connection terminal ends so that the application of heat to said component allows the connection means to flow and electrically connect the component into an electrical circuit, said circuit element being formed of a generally rectangular shape and including planar upper and lower faces, at least two ends of said rectangular circuit element and associated portions of said upper and lower faces being enveloped by and received within said preformed connection means, said preformed connection means being constructed as a one piece element including an intermediate portion joining said first and second end portions, and including generally planar end portions adapted to engage corresponding planar portions of said circuit element, said intermediate portion including at least one section with a cross sectional area which is substantially smaller than the cross sectional area of said end portions.

6. A circuit component in accordance with claim 5 wherein the preformed connection means is a solder preform which is hollow and which has flux enclosed inside of said preform.

* * * * *